United States Patent
Aramaki et al.

(10) Patent No.: US 9,922,901 B2
(45) Date of Patent: Mar. 20, 2018

(54) HEAT CONDUCTION SHEET, HEAT CONDUCTION SHEET MANUFACTURE METHOD, HEAT RADIATION MEMBER, AND SEMICONDUCTOR DEVICE

(71) Applicant: Dexerials Corporation, Shinagawa-ku, Tokyo (JP)

(72) Inventors: Keisuke Aramaki, Tokyo (JP); Hiroki Kanaya, Tokyo (JP); Masahide Daimon, Tokyo (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/521,426

(22) PCT Filed: Oct. 27, 2015

(86) PCT No.: PCT/JP2015/080303
§ 371 (c)(1),
(2) Date: Apr. 24, 2017

(87) PCT Pub. No.: WO2016/068157
PCT Pub. Date: May 6, 2016

(65) Prior Publication Data
US 2017/0309542 A1  Oct. 26, 2017

(30) Foreign Application Priority Data

Oct. 31, 2014 (JP) .................................. 2014-222723
Oct. 9, 2015 (JP) .................................. 2015-201410

(51) Int. Cl.
*H01L 23/48* (2006.01)
*H01L 23/52* (2006.01)
(Continued)

(52) U.S. Cl.
CPC .......... *H01L 23/373* (2013.01); *B81B 3/0081* (2013.01)

(58) Field of Classification Search
CPC ............. H01L 2224/8336; H01L 35/22; H01L 21/4882; H01L 23/42; H01L 2224/8385
(Continued)

(56) References Cited

U.S. PATENT DOCUMENTS 6,469,381 B1 * 10/2002 Houle ................. H01L 21/4882
257/704
7,253,523 B2 * 8/2007 Dani ...................... C09K 5/063
257/706
(Continued)

FOREIGN PATENT DOCUMENTS

JP  H05235217  9/1993
JP  06-291226  10/1994
(Continued)

OTHER PUBLICATIONS

Notice of Reasons for Rejection for Patent Application No. JP 2015-201410, Japan Patent Office (dated May 10, 2016).
(Continued)

Primary Examiner — S. V. Clark
(74) Attorney, Agent, or Firm — Carmody Torrance Sandak & Hennessey LLP

(57) ABSTRACT

A thermally conductive sheet including a sheet body that is a cured product of a thermally conductive resin composition including a binder resin and carbon fibers covered with insulating coating films, wherein the carbon fibers exposed on a surface of the sheet body are not covered with the insulating coating films and are covered with a component of the binder resin.

13 Claims, 3 Drawing Sheets

(51) Int. Cl.
*H01L 29/40* (2006.01)
*H01L 23/373* (2006.01)
*B81B 3/00* (2006.01)

(58) Field of Classification Search
USPC ......... 257/782, 787, 706, 707; 438/118, 127
See application file for complete search history.

(56) References Cited

U.S. PATENT DOCUMENTS

| | | | | |
|---|---|---|---|---|
| 7,846,778 | B2* | 12/2010 | Rumer | H01L 23/4275 257/707 |
| 8,703,286 | B2* | 4/2014 | Jayaraman | H01L 23/42 257/704 |
| 2003/0128521 | A1* | 7/2003 | Matayabas, Jr. | H01L 23/3737 361/705 |
| 2009/0237886 | A1 | 9/2009 | Iwai et al. | |
| 2012/0068364 | A1* | 3/2012 | Mengel | H01L 24/27 257/783 |
| 2014/0182823 | A1 | 7/2014 | Cumberland | |
| 2015/0118505 | A1 | 4/2015 | Aramaki | |
| 2015/0144316 | A1 | 5/2015 | Aramaki | |
| 2016/0141223 | A1 | 5/2016 | Aramaki et al. | |
| 2016/0150680 | A1 | 5/2016 | Aramaki et al. | |

FOREIGN PATENT DOCUMENTS

| | | |
|---|---|---|
| JP | H08183875 | 7/1996 |
| JP | 09-017915 | 1/1997 |
| JP | 2002-059257 | 2/2002 |
| JP | 2007-107151 | 4/2007 |
| JP | 2007-128986 | 5/2007 |
| JP | 2009215404 | 9/2009 |
| JP | 2012023335 | 2/2012 |
| JP | 2014-31502 | 2/2014 |

OTHER PUBLICATIONS

Decision of Rejection for Patent Application No. JP 2015-201410, Japan Patent Office (dated Sep. 6, 2016).
Pretrial Report for Trial No. 2016-016757 for Patent Application No. JP 2015-201410, Japan Patent Office (dated Dec. 22, 2016).

* cited by examiner

HEAT CONDUCTION SHEET, HEAT CONDUCTION SHEET MANUFACTURE METHOD, HEAT RADIATION MEMBER, AND SEMICONDUCTOR DEVICE

TECHNICAL FIELD

The present invention relates to a thermally conductive sheet disposed between a heat-generating body such as a semiconductor element and a heat-dissipating body such as a heat sink, a method for producing a thermally conductive sheet, and a heat-dissipating member and a semiconductor device each including a thermally conductive sheet.

BACKGROUND ART

Conventionally, semiconductor elements mounted in various electrical devices such as personal computers and other devices have used various cooling units. This is because when heat is generated by driving and the generated heat accumulates, the driving of the semiconductor elements and peripheral devices are adversely affected. Known methods for cooling electronic parts such as semiconductor elements include a system of attaching a fan to the device to cool the air inside the device housing, and a method of attaching a heat sink such as a heat-dissipating fin or a heat-dissipating plate to semiconductor elements to be cooled.

When a heat sink is attached to a semiconductor element to cool the semiconductor element, a thermally conductive sheet is provided between the semiconductor element and the heat sink in order to efficiently dissipate heat of the semiconductor element. As the thermally conductive sheet, widely used are those in which thermally conductive fillers [such as scaly particles (e.g., boron nitride (BN) and graphite) and carbon fibers] are dispersed and contained in a silicone resin (see PTL 1).

These thermally conductive fillers have anisotropy of thermal conductivity. For example, when carbon fibers are used as the thermally conductive fillers, they are known to have a thermal conductivity of about 600 W/m·K to about 1200 W/m·K in the fiber direction. When boron nitride is used, it is known to have a thermal conductivity of about 110 W/m·K in the plane direction and a thermal conductivity of about 2 W/m·K in the direction perpendicular to the plane direction.

CITATION LIST

Patent Literature

PTL 1: Japanese Patent Application Laid-Open No. 2012-23335

SUMMARY OF INVENTION

Technical Problem

However, in the case of the thermally conductive sheet using thermally conductive fillers having not only excellent thermal conductivity but also electrical conductivity (e.g., carbon fibers), there are concerns about occurrence of failures of electronic devices such as short circuiting due to the thermally conductive fillers exposed on the sheet surface, when the thermally conductive sheet contacts the circuits around the semiconductor element or when the sheet involves defects and falls onto the circuits.

Meanwhile, when thermally conductive fillers are buried in the sheet body in order to ensure electrical insulating property of the thermally conductive sheet, the effect of high thermal conductivity provided by the thermally conductive fillers will be degraded.

In view of this, the present invention has an object to provide a thermally conductive sheet that can ensure electrical insulating property and maintain high thermal conductivity even under unforeseeable circumstances such as contact of the thermally conductive sheet, a method for producing a thermally conductive sheet, a heat-dissipating member, and a semiconductor device.

Solution to Problem

In order to solve the above-described problem, a thermally conductive sheet according to the present invention includes a sheet body that is a cured product of a thermally conductive resin composition including a binder resin and carbon fibers covered with insulating coating films, wherein the carbon fibers exposed on a surface of the sheet body are not covered with the insulating coating films and are covered with a component of the binder resin.

Also, a method according to the present invention for producing a thermally conductive sheet includes: molding a thermally conductive resin composition, including a binder resin and carbon fibers covered with insulating coating films, into a predetermined shape and curing the thermally conductive resin composition, to thereby obtain a molded product of the thermally conductive resin composition;

cutting the molded product into a sheet to obtain a sheet body; and covering the carbon fibers exposed on a surface of the sheet body with a component of the binder resin, wherein in the cutting, the insulating coating films covering the carbon fibers exposed on the surface of the sheet body are removed.

Also, a heat-dissipating member according to the present invention includes: a heat spreader configured to dissipate heat generated by an electronic part; and the thermally conductive sheet disposed on the heat spreader and held between the heat spreader and the electronic part.

Also, a semiconductor device according to the present invention includes: a heat spreader configured to dissipate heat generated by the semiconductor element; and the thermally conductive sheet disposed on the heat spreader and held between the heat spreader and the semiconductor element.

Advantageous Effects of the Invention

According to the present invention, it is possible to suppress reduction in thermal conductivity due to the insulating coating films, because the carbon fibers exposed on the surface of the sheet body are not covered with the insulating coating films. Also, the thermally conductive sheet according to the present invention can successfully achieve both insulating property and thermal conductivity of the sheet, because the carbon fibers exposed on the surface of the sheet body and not covered with the insulating coating films are covered with a component of the binder resin.

DESCRIPTION OF EMBODIMENTS

Next, the thermally conductive sheet, the method for producing a thermally conductive sheet, the heat-dissipating member, and the semiconductor device to which the present invention has been applied will be described in detail with reference to the drawings. Note that, the present invention is not limited to the following embodiments only, and naturally, various modifications can be made within a scope not departing from the gist of the present invention. Also, the drawings are schematic ones, and the rate and the like of each dimension may be different from actual ones. Specific dimensions and the like should be judged considering the following description. Also, even between the drawings, naturally, there are some parts that are different in the relationship of their dimensions and their rates.

Figure 1:
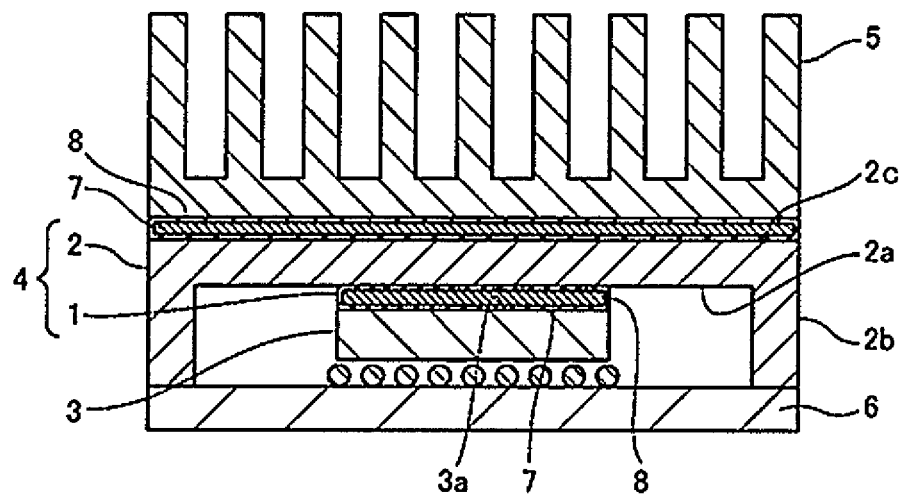
FIG. 1 is a cross-sectional view illustrating a thermally conductive sheet, a heat-dissipating member, and a semiconductor device to which the present invention has been applied.

A thermally conductive sheet 1 to which the present invention has been applied is configured to dissipate heat generated by an electronic part 3 such as a semiconductor element. As illustrated in FIG. 1, the thermally conductive sheet is fixed to a main surface 2a of a heat spreader 2 facing the electronic part 3 and is held between the electronic part 3 and the heat spreader 2. Also, the thermally conductive sheet is held between the heat spreader 2 and a heat sink 5. Together with the heat spreader 2, the thermally conductive sheet constitutes a heat-dissipating member 4 configured to dissipate heat of the electronic part 3.

The heat spreader 2 is formed into a square or rectangular plate shape, for example. The heat spreader has the main surface 2a facing the electronic part 3 and a side wall 2b vertically disposed along the outer periphery of the main surface 2a. The heat spreader 2 is provided with the thermally conductive sheet 1 in the main surface 2a surrounded by the side wall 2b and is provided with the heat sink 5 via the thermally conductive sheet 1 in the other surface 2c opposite to the main surface 2a. If having higher thermal conductivity, the heat spreader 2 decreases in thermal resistance and more efficiently absorbs heat of the electronic part 4 such as a semiconductor element. Thus, it can be formed of, for example, copper or aluminum having good thermal conductivity.

The electronic part 3 is, for example, a semiconductor element such as BGA and is mounted on a circuit board 6. Also in the heat spreader 2, the leading end surface of the side wall 2b is mounted on the circuit board 6, and thereby the side wall 2b surrounds the electronic part 3 with a predetermined distance provided between them.

Adhering the thermally conductive sheet 1 to the main surface 2a of the heat spreader 2 forms the heat-dissipating member 4 configured to absorb heat generated by the semiconductor element and dissipate the heat from the heat sink 5. The adhesion between the heat spreader 2 and the thermally conductive sheet 1 can be achieved by adhesion power of the below-described thermally conductive sheet 1 itself. However, an adhesive may appropriately be used. The adhesive usable is a known heat-dissipating resin or heat-dissipating adhesive film responsible for adhesion and thermal conduction between the thermally conductive sheet 1 and the heat spreader 2.

[Thermally Conductive Sheet]

The thermally conductive sheet 1 includes a sheet body 7 that is a cured product of a thermally conductive resin composition including a binder resin and carbon fibers 11 covered with insulating coating films, wherein the carbon fibers 11 exposed on a surface of the sheet body 7 are not covered with the insulating coating films and are covered with an uncured component 8 of the binder resin oozed out from the sheet body 7.

Figure 2:
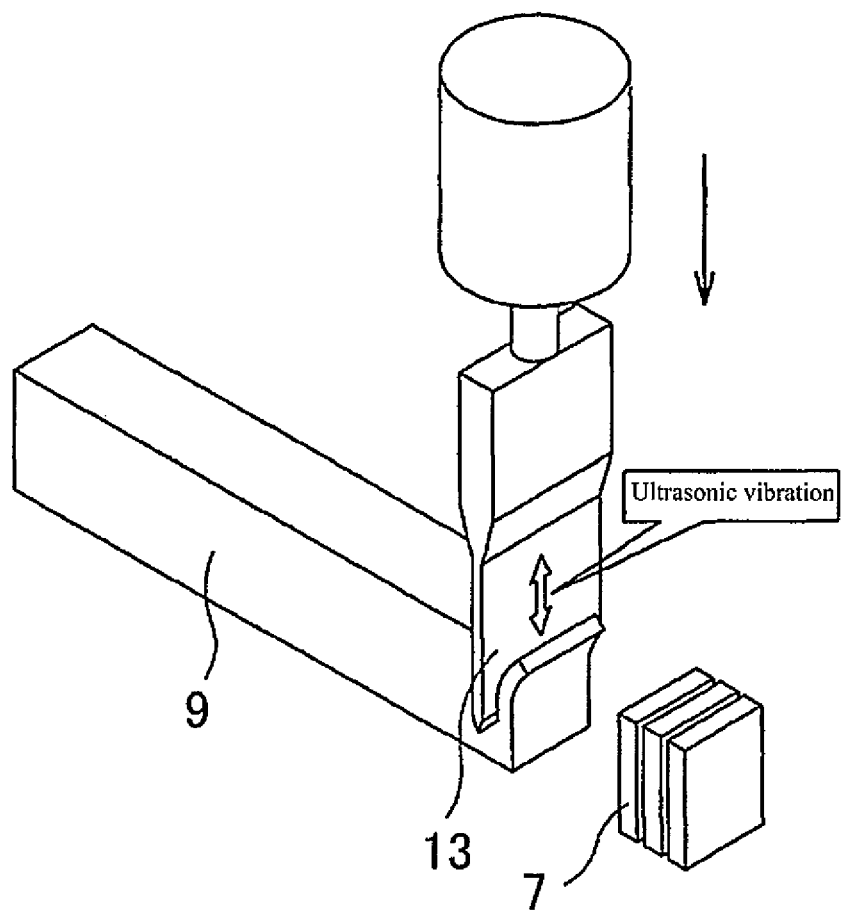
FIG. 2 is a perspective view illustrating a step of slicing a resin molded product to cut out sheet bodies.
Figure 3A:
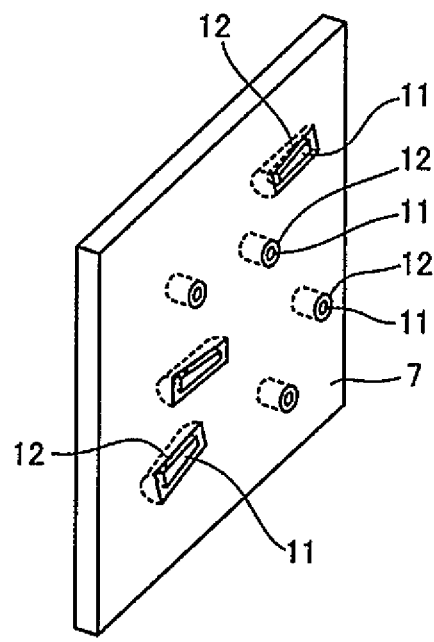
FIG. 3A is a perspective view illustrating a sheet body cut out from a resin molded product.
Figure 3B:
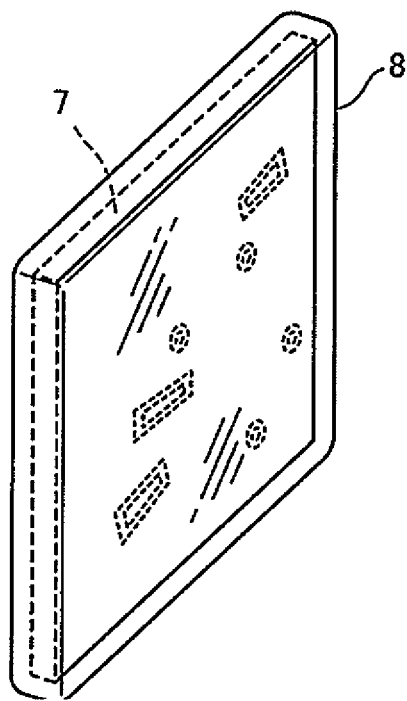
FIG. 3B is a perspective view illustrating a state where a sheet body is covered with a component of a binder resin.

As illustrated in FIG. 2, FIG. 3A, and FIG. 3B, the thermally conductive sheet 1 is produced by: curing a thermally conductive resin composition, including a binder resin and carbon fibers 11 covered with insulating coating films, to form a resin molded product 9; cutting it into a sheet to obtain a sheet body 7 where the carbon fibers 11 are exposed on the sheet surface; then pressing or leaving the sheet body 7 to stand; and covering the sheet body 7 and the carbon fibers 11 exposed on the surface of the sheet body 7 with the uncured component 8 of the binder resin. Note that, the carbon fibers 11 exposed on the surface of the sheet body 7 are not covered with the insulating coating films 12. Details will be described below.

The carbon fibers 11 constituting the thermally conductive sheet 1 are for efficiently conducting heat from the electronic part 3 to the heat spreader 2. When the carbon fibers 11 have too small an average diameter, their specific surface area is too large, raising concerns about too high a viscosity of a resin composition for forming the thermally conductive sheet 1. When they have too large an average diameter, it may be difficult to form a molded product. Therefore, the average diameter of the carbon fibers 11 is preferably from 5 μm to 12 μm. Also, their average fiber length is preferably from 30 μm to 300 μm. When the average fiber length of the carbon fibers 11 is less than 30 μm, their specific surface area is too large and the viscosity of the thermally conductive resin composition tends to be too high. When it is larger than 300 μm, the carbon fibers tend to inhibit compression of the thermally conductive sheet 1.

The carbon fibers 11 are selected depending on properties required for the thermally conductive sheet 1, such as mechanical properties, thermal properties, and electrical properties. Among them, pitch-based carbon fibers or carbon fibers obtained by graphitizing polybenzazole can be preferably used because these exhibit, for example, high elastic modulus, good thermal conductivity, high electrical conductivity, radio wave shielding property, and low thermal expansion.

Regarding an amount of the carbon fibers 11 in the thermally conductive sheet 1, there is a tendency that when it is too small, the thermal conductivity becomes low and when it is too large, the viscosity becomes high. Thus, the amount of the carbon fibers is preferably from 16% by volume to 40% by volume.

[Insulating Coating Film]

Figure 4:
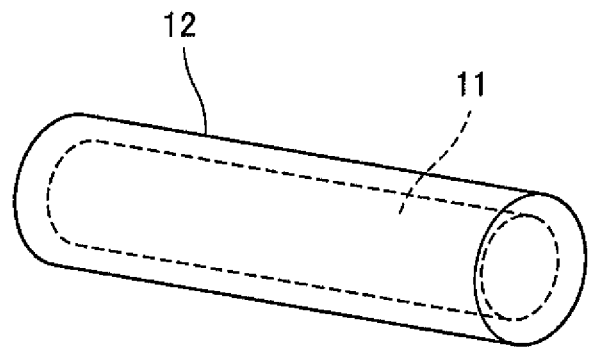
FIG. 4 is a perspective view illustrating a carbon fiber covered with an insulating coating film.

As illustrated in FIG. 4, the surface of the carbon fiber 11 is covered with the insulating coating film 12. The insulating coating film 12 can be formed using, for example, materials having excellent electrical insulating property such as silicon oxide and boron nitride. Also, examples of a method for covering the carbon fiber 11 with the insulating coating film 12 include a sol-gel method, a liquid-phase deposition method, and a polysiloxane method. Note that, in order to increase adhesion between the carbon fiber 11 and the insulating coating film 12, the surface of the carbon fiber 11 may be oxidized by, for example, a vapor phase method, a chemical liquid treatment, or an electrolytic method.

When the insulating coating films 12 covering the carbon fibers 11 are silicon oxide, an average thickness of the insulating coating film 12 is preferably 50 nm or more but less than 100 nm as observed through cross-sectional TEM observation.

Forming the insulating coating films 12 having an average thickness of less than 50 nm needs to reduce the concentration in the coating film treatment. Thus, it takes a long time to form the coating films, which leads to not only lowered productivity but also increased waste liquid due to reduction of the treated amount of a batch. Also, even by increasing the concentration in the coating film treatment, it is difficult to control the thickness, which may lead to not only lowered productivity but also degraded insulating performances such as partial exposure of the carbon fiber 11.

Forming the insulating coating films 12 having an average thickness of 100 nm or more involves formation of silica in the form of fine particles in addition to silica that contributes to formation of the insulating coating films 12 covering the carbon fibers 11. Therefore, when the carbon fibers 11 covered with the insulating coating films 12 are mixed in the binder resin, the silica in the form of fine particles is also mixed at the same time, causing degradation in thermal resistance. Also, one conceivable method is to vary the concentration in the coating film treatment to repeat the treatment a plurality of times for adjusting the film thickness. However, an increased number of the coating treatments leads to a decrease in production efficiency and an increase in waste liquid amount, which is not preferable.

[Thermally Conductive Filler]

In addition to the carbon fibers 11, thermally conductive fillers such as fibrous fillers, plate-form fillers, scaly fillers, and spherical fillers may be used in combination with the carbon fibers 11, so long as the effects of the present invention are not impaired.

Examples of the thermally conductive fillers include various fillers such as metals (e.g., nickel and iron), glass, and ceramics [e.g., non-metal inorganic fibers such as oxides (e.g., aluminum oxide and silicon dioxide), nitrides (e.g., boron nitride and aluminum nitride), borides (e.g., aluminum boride), and carbides (e.g., silicon carbide)].

In particular, from the viewpoint of suppressing secondary aggregation of the carbon fibers 11 in the thermally conductive resin composition, spherical fillers 0.1 µm to 10 µm in diameter (preferably spherical alumina or spherical aluminum nitride) are preferably used in combination in an amount of from 50 parts by mass to 900 parts by mass relative to 100 parts by mass of the carbon fibers 11.

[Binder Resin]

The binder resin retains the carbon fibers 11 and appropriately added thermally conductive fillers in the thermally conductive sheet 1, and is selected depending on properties required for the thermally conductive sheet 1, such as mechanical properties, thermal properties, and electrical properties. Such a binder resin may be selected from thermoplastic resins, thermoplastic elastomers, and thermosetting resins.

Examples of the thermoplastic resins include ethylene-α-olefin copolymers such as polyethylene, polypropylene, and ethylene-propylene copolymers, polymethylpentene, polyvinyl chloride, polyvinylidene chloride, polyvinyl acetate, ethylene-vinyl acetate copolymers, polyvinyl alcohol, polyvinyl acetals, fluorine-based polymers such as polyvinylidene fluoride and polytetrafluoroethylene, polyethylene terephthalate, polybutylene terephthalate, polyethylene naphthalate, polystyrene, polyacrylonitrile, styrene-acrylonitrile copolymers, acrylonitrile-butadiene-styrene copolymer (ABS) resins, polyphenylene-ether copolymer (PPE) resins, modified PPE resins, aliphatic polyamides, aromatic polyamides, polyimides, polyamideimides, polymethacrylic acid, polymethacrylic acid esters such as methyl polymethacrylate, polyacrylic acid, polycarbonates, polyphenylene sulfide, polysulfones, polyethersulfones, polyethernitriles, polyetherketones, polyketones, liquid crystal polymers, silicone resins, and ionomers.

Examples of the thermoplastic elastomers include styrene-butadiene block copolymers or hydrogenated products thereof, styrene-isoprene block copolymers or hydrogenated products thereof, styrene-based thermoplastic elastomers, olefin-based thermoplastic elastomers, vinyl chloride-based thermoplastic elastomers, polyester-based thermoplastic elastomers, polyurethane-based thermoplastic elastomers, and polyamide-based thermoplastic elastomers.

Examples of the thermosetting resins include crosslinked rubbers, epoxy resins, phenolic resins, polyimide resins, unsaturated polyester resins, and diallyl phthalate resins. Specific examples of the crosslinked rubbers include natural rubbers, acrylic rubbers, butadiene rubbers, isoprene rubbers, styrene-butadiene copolymer rubbers, nitrile rubbers, hydrogenated nitrile rubbers, chloroprene rubbers, ethylene-propylene copolymer rubbers, chlorinated polyethylene rubbers, chlorosulfonated polyethylene rubbers, butyl rubbers, halogenated butyl rubbers, fluororubbers, urethane rubbers, and silicone rubbers.

The thermally conductive resin composition can be prepared by homogeneously mixing the fibrous fillers and the binder resin with optionally used various additives and volatile solvent by a known method.

The above-described thermally conductive sheet 1 is produced, as described below, by curing a thermally conductive resin composition, including the carbon fibers 11 covered with the insulating coating films 12 in the binder resin, to form a resin molded product 9; slicing it into a sheet to obtain a sheet body 7 where the carbon fibers 11 are exposed on the sheet surface; and then pressing or leaving the sheet body 7 to stand.

The slicing removes the insulating coating films 12 from the carbon fibers 11 exposed on the sheet surface. The resultant thermally conductive sheet 1 can be suppressed in reduction of thermal conductivity due to the insulating coating film 12. Then, the sheet body 7 is pressed or left to stand such that the carbon fibers 11, from which the insulating coating films 12 have been removed, are covered with the uncured component 8 of the binder resin oozed out to the surface. Therefore, the resultant thermally conductive sheet 1 can successfully achieve both insulating property and thermal conductivity of the sheet.

Also, when the thermally conductive sheet 1 is pressed or left to stand, the uncured component 8 of the binder resin oozes out from the sheet body 7 over the entire surface to cover the following (1) and (2) with the uncured component 8.

(1) The surface of the sheet body 7
(2) The carbon fibers 11 exposed on the surface of the sheet body 7

As a result, the thermally conductive sheet 1 develops slight adhesiveness (tackiness) on the sheet surface. Therefore, the thermally conductive sheet 1 is improved in followability and close adhesiveness to the surfaces of the electronic part 3 and the heat spreader 2, making it possible to reduce thermal resistance even in low-load regions.

Also, when the surface of the sheet body 7 is covered with the uncured component 8 of the binder resin and the thermally conductive sheet 1 develops slight adhesiveness on the surface thereof, the thermally conductive sheet 1 can be adhered on the main surface 2a of the heat spreader 2 or temporarily fixed to the top surface 3a of the electronic part 3. As a result, the thermally conductive sheet 1 does not need any separately-used adhesive, and can realize power saving and cost reduction in the production steps.

The uncured component 8 covering the surface of the sheet body 7 and the uncured component 8 covering the carbon fibers 11 from which the insulating coating films 12 have been removed do not necessarily have enough thicknesses to completely bury the carbon fibers 11 from which the insulating coating films 12 have been removed. So long as the surface of the sheet body 7 and the carbon fibers 11 from which the insulating coating films 12 have been removed are covered, the uncured component 8 may have such a thickness as to be able to recognize the shapes of the carbon fibers 11 from which the insulating coating films 12 have been removed.

Here, the thermally conductive sheet 1 can be allowed to develop desired slight adhesiveness (tackiness) by adjusting the compositional ratio between a main agent and a curing agent of the binder resin for the thermally conductive resin composition. For example, when a two-part addition reaction type liquid silicone resin is used as the binder resin for the thermally conductive resin composition, the compositional ratio between the main agent and the curing agent is preferably as follows.

Main agent:Curing agent=50:50 to 65:35 (mass ratio)

The above compositional ratio allows the thermally conductive sheet 1 to retain its sheet shape. At the same time, by pressing or leaving it to stand, the uncured component 8 of the binder resin oozes out to cover the entire surface of the sheet body 7, making it possible to achieve an appropriate level of slight adhesiveness in the entire sheet.

When the component of the main agent is less than this compositional ratio, curing of the binder resin proceeds and the thermally conductive sheet 1 lacks flexibility. In addition, the sheet body 7 is insufficiently covered with the uncured component 8 of the binder resin, and the sheet body 7 does not develop slight adhesiveness in at least a part thereof. When the component of the curing agent is less than this compositional ratio, excessive adhesiveness develops to make it impossible to retain the sheet shape. In addition, it becomes difficult to cut out the molded product into a sheet, which leads to impaired handling property.

The thermally conductive sheet 1 preferably has a Shore OO hardness of 70 or lower as measured by the measurement method according to ASTM-D2240. When the hardness of the thermally conductive sheet 1 is higher than 70 in terms of Shore OO hardness, the sheet body 7 cannot exhibit sufficient flexibility. This may reduce followability and close adhesiveness to the surfaces of the electronic part 3 and the heat spreader 2, and increase thermal resistance. Note that, the lower limit of the hardness of the thermally conductive sheet 1 is not particularly limited.

Also, the thermally conductive sheet 1 preferably has a volume resistance of $1\times10^6$ Ω·cm or higher. In this range of volume resistance, even if the thermally conductive sheet 1 contacts circuit parts therearound, there is no concern that it causes, for example, failures of electronic devices.

Example of the surface profile of the thermally conductive sheet include the following.

Figure 5:
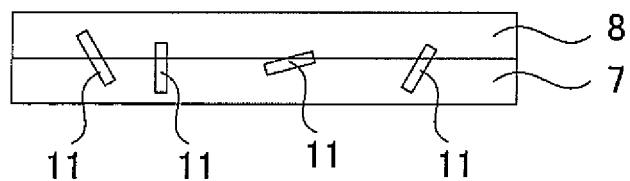
FIG. 5 is a cross-sectional view illustrating one example of a surface profile of a thermally conductive sheet.

One example is an aspect where the surface is smooth as illustrated in FIG. 5. In this case, the surface of the uncured component 8 covering the carbon fibers 11 is smooth.

Figure 6:
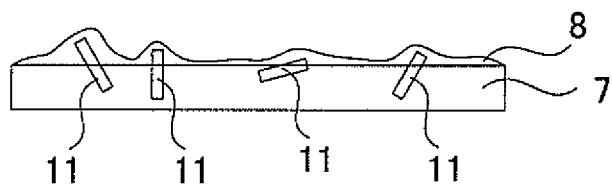
FIG. 6 is a cross-sectional view illustrating another example of a surface profile of a thermally conductive sheet.

The other example is an aspect where the surface has convex portions derived from the carbon fibers 11 exposed on the surface of the sheet body 7 as illustrated in FIG. 6. In this case, the surface of the uncured component 8 covering the carbon fibers 11 is not smooth, and has convex portions derived from the carbon fibers 11.

Note in FIG. 5 and FIG. 6 that, the insulating coating films 12 covering the carbon fibers 11 are omitted.

[Production Steps of the Thermally Conductive Sheet]

The thermally conductive sheet 1 of the present invention can be produced by a production method including the following steps (A) to (D). Each step will be described below in detail.

<Step A>

First, a thermally conductive resin composition for forming the thermally conductive sheet 1 is prepared by dispersing, in a binder resin, the carbon fibers 11 covered with the insulating coating films 12 and optionally-added thermally conductive fillers. This preparation can be performed by homogeneously mixing the carbon fibers 11, the thermally conductive fillers, the binder resin, and optionally-added various additives and volatile solvent by a known method.

<Step B>

Next, a resin molded product 9 in the form of a block is formed from the prepared thermally conductive resin composition by an extrusion molding method or a mold molding method.

The extrusion molding method or the mold molding method is not particularly limited and may be appropriately selected from various known extrusion molding methods or mold molding methods depending on, for example, the viscosity of the thermally conductive resin composition and properties required for the thermally conductive sheet 1.

When the thermally conductive resin composition is extruded through a die in the extrusion molding method or the thermally conductive resin composition is charged by pressure into a mold in the mold molding method, the binder resin flows and some of the carbon fibers 11 are oriented along the flow direction. However, many of the carbon fibers 11 are randomly oriented.

When a slit is attached to the tip of the die, there is a tendency that the carbon fibers 11 are easily oriented in a central portion with respect to the width direction of the extruded resin molded product 9. In peripheral portions with respect to the width direction of the resin molded product 9, the carbon fibers 11 are randomly oriented due to influence of the slit wall.

The size and shape of the resin molded product 9 can be determined depending on the required size of the thermally conductive sheet 1. One example thereof is a cuboid whose cross section has a height of from 0.5 cm to 15 cm and a width of from 0.5 cm to 15 cm. The depth of the cuboid may be determined according to the necessity.

<Step C>

Next, the formed resin molded product 9 is sliced into a sheet. This produces the sheet body 7. In this sheet body 7, the carbon fibers 11 are exposed on the surface (sliced surface) of the sheet obtained by the slicing. At this time, not only the resin molded product 9 but also the carbon fibers 11 are cut. Thus, the insulating coating films 12 covering the carbon fibers 11 exposed on the sheet surface are removed (in other words, the carbon fibers 11 exposed on the sheet surface are not covered with the insulating coating films 12). Therefore, the thermally conductive sheet 1 can maintain good thermal conductivity over the thickness direction.

The method of slicing is not particularly limited and may be appropriately selected from a known slicing device 13 (preferably an ultrasonic cutter or a plane) depending on the size and mechanical strength of the resin molded product 9. When the molding method is an extrusion molding method, the direction of slicing the resin molded product 9 is a direction that is from 60 degrees to 120 degrees, more preferably 70 degrees to 100 degrees, relative to the extrusion direction because some are oriented in the extrusion direction. Particularly preferably, it is a direction of 90 degrees (a perpendicular direction).

The slice thickness is not particularly limited and may be appropriately selected depending on, for example, the intended use of the thermally conductive sheet 1.

<Step D>

Next, the carbon fibers 11 exposed on the surface of the sheet body 7 are covered with the component of the binder resin. Examples of a method for this include the following methods.

(1) Covering the surface of the sheet body 7 and the carbon fibers 11 exposed from the surface of the sheet body 7 with the uncured component 8 of the binder resin oozed out from the sheet body 7 by pressing the sheet body 7.
(2) Covering the surface of the sheet body 7 and the carbon fibers 11 exposed from the surface of the sheet body 7 with the uncured component 8 of the binder resin oozed out from the sheet body 7 by leaving the sheet body 7 to stand.

First, the above method (1) will be described.

The sliced surface of the obtained sheet body 7 is pressed. The pressing method can use a pair of pressing devices composed of a flat plate and a press head having a smooth surface. Alternatively, a pinch roll may be used for the pressing.

Depending on the pressing conditions, an obtained surface profile of the thermally conductive sheet is different.

Next, the above method (2) will be described.

The obtained sheet body 7 is left to stand. Depending on the time during which it is left to stand, an obtained surface profile of the thermally conductive sheet is different.

For example, leaving it to stand in a short time provides a thermally conductive sheet whose surface has convex portions derived from the carbon fibers 11 exposed on the surface of the sheet body 7 as illustrated in FIG. 6.

Leaving it to stand in a long time provides a thermally conductive sheet whose surface is smooth as illustrated in FIG. 5.

As a result of this, the uncured component 8 of the binder resin oozes out from the sheet body 7 to obtain the thermally conductive sheet 1 which is the sheet body 7 covered with the uncured component 8 (see FIG. 3B). In the thermally conductive sheet 1, the carbon fibers 11 exposed on the sliced surface (the carbon fibers 11 not covered with the insulating coating films) are covered with the uncured component 8 of the binder resin. Therefore, the thermally conductive sheet 1 can ensure electrical insulating property, and even when thermally conductive sheet 1 contacts the circuits around the semiconductor element or even when the thermally conductive sheet 1 involves defects and falls onto the circuits, it is possible to prevent failures of electronic devices due to short circuiting.

Also, the thermally conductive sheet 1 develops slight adhesiveness (tackiness) on the sheet surface. As a result, the thermally conductive sheet 1 can be improved in followability and close adhesiveness to the surfaces of the electronic part 3 and the heat spreader 2, and be reduced in thermal resistance.

Also, when the surface of the sheet body 7 is covered with the uncured component 8 of the binder resin and the thermally conductive sheet 1 develops slight adhesiveness on the surface thereof, the thermally conductive sheet 1 can be adhered on the main surface 2a of the heat spreader 2 or temporarily fixed to the top surface 3a of the electronic part 3. As a result, the thermally conductive sheet 1 does not need any separately-used adhesive, and can realize power saving and cost reduction in the production steps.

Moreover, even when the thermally conductive sheet 1 loses slight adhesiveness on the surface during handling, pressing it allows the uncured component 8 of the binder resin to ooze out again from the sheet body 7, and the surface is covered with the uncured component 8. Therefore, repair is possible even when the thermally conductive sheet 1 is adhered to the heat spreader 2 or temporarily fixed to the electronic part 3 at a different position from the intended position.

Also, in the thermally conductive sheet 1, the uncured component 8 of the binder resin oozes out from the entire surface of the sheet body 7 to cover not only front and back surfaces of the sheet body 7 but also side surfaces thereof. The uncured component 8 of the binder resin has insulating property, and thus insulating property is imparted to the side surfaces of the thermally conductive sheet 1. Therefore, even when the thermally conductive sheet 1 is held between the electronic part 3 and the heat spreader 2 and swollen out therearound to contact an electrically conductive member disposed therearound, it is possible to prevent short circuiting between the semiconductor element or the heat sink and the electrically conductive member via the thermally conductive sheet 1.

The thermally conductive sheet 1 is compressed in the thickness direction by being pressed. As a result, it is possible to increase the frequency of contact between the carbon fibers 11 or the thermally conductive fillers. This makes it possible to reduce thermal resistance of the thermally conductive sheet 1. Also, the surface of the thermally conductive sheet 1 is made smooth by being pressed.

Regarding the pressure upon the pressing, when it is too low, thermal resistance tends to remain unchanged from the case where no pressing is performed, and when it is too high, the sheet tends to be stretched. Thus, the pressure is preferably from 0.0098 MPa to 9.8 MPa, more preferably from 0.049 MPa to 9.3 MPa.

Figure 7:
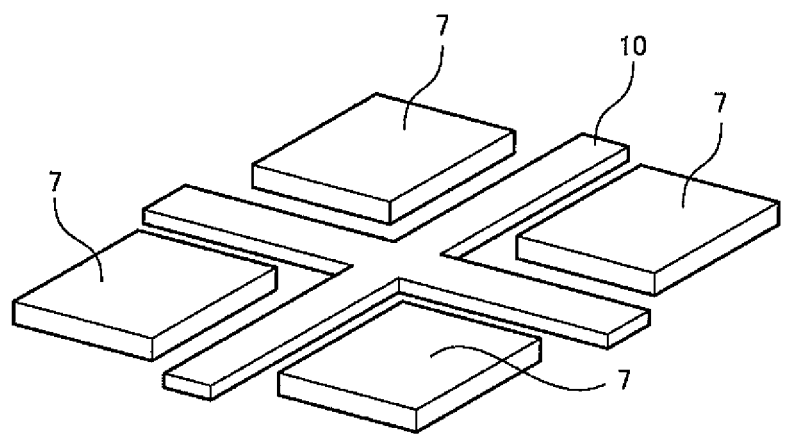
FIG. 7 is a perspective view illustrating a state where sheet bodies are pressed via a spacer.

Also, when the sheet body 7 is pressed with a spacer 10 disposed on a placement surface facing a press head as illustrated in FIG. 7, the thermally conductive sheet 1 can be formed to have a predetermined sheet thickness corresponding to the height of the spacer 10.

In the thermally conductive sheet 1, the uncured component 8 of the binder resin oozes out by pressing the sheet body 7, and stops oozing out when it covers the entirety of the sheet surface. The pressing time can appropriately be set as an enough time for the uncured component 8 of the binder resin to ooze out to cover the entirety of the surface of the sheet body 7, depending on, for example, the formulation ratio of the component of the binder resin and the curing agent component in the binder resin, the pressing pressure, and the sheet area.

Also, the pressing step may be performed under heating using a press head with a built-in heater, in order to more promote oozing out of the uncured component 8 of the binder resin and the effect of covering the surface of the sheet body 7. In order to increase such effects, the heating temperature is preferably equal to or higher than the glass transition temperature of the binder resin. This can shorten the pressing time.

EXAMPLES

Examples of the present invention will next be described. In the present Examples, thermally conductive sheet samples were formed by varying the compositional ratio between the binder component and the curing agent component in the thermally conductive resin composition and using carbon fibers covered with or without insulating coating by insulating coating films. Each of the samples was measured and evaluated for presence or absence of slight adhesiveness, Shore OO hardness, compressive stress [N], initial sheet thickness [mm], thermal resistance (K·cm$^2$/W), and volume resistance [Ω·cm].

Production Example 1: Treatment of Carbon Fibers to have Insulating Coating Films Insulating coating films were formed on the carbon fibers used in each of the Examples by the following method.

Specifically, a resin container (PE) was charged with the first formulation [300 g of pitch-based carbon fibers having an average fiber length of 100 μm and an average fiber diameter of 9 μm (thermally conductive fibers: product of Nippon Graphite Fiber Co., Ltd.), 600 g of tetraethoxysilane, and 2700 g of ethanol], followed by mixing with an impeller. The second formulation (1050 g of 10% by mass aqueous ammonia) was charged thereto for 5 minutes. The resultant mixture was stirred for 3 hours from the time (0 min) when the charging of the second formulation completed. After completion of the stirring, the mixture was subjected to aspiration filtration using a vacuum pump. The recovered sample was transferred to a beaker and washed with water and ethanol. The resultant was filtrated again to recover the sample. The recovered sample was dried at 100° C. for 2 hours, followed by baking at 200° C. for 8 hours, to obtain covered carbon fibers.

As a result of measuring the length of the cross section through TEM, coating films having an average thickness of 77 nm and made mainly of $SiO_2$ were observed.

Production Example 2: Treatment of Carbon Fibers to have Insulating Coating Films Covered carbon fibers were obtained in the same manner as in Production Example 1 except that the pitch-based carbon fibers in Production Example 1 were changed to the following pitch-based carbon fibers to perform a treatment of the carbon fibers to have insulating coating films.

Pitch-based carbon fibers (thermally conductive fibers, average fiber length: 150 μm, average fiber diameter: 9 μm, product of Nippon Graphite Fiber Co., Ltd.)

As a result of measuring the length of the cross section through TEM, coating films having an average thickness of 55 nm and made mainly of $SiO_2$ were observed.

Production Example 3: Treatment of Carbon Fibers to have Insulating Coating Films Covered carbon fibers were obtained in the same manner as in Production Example 1 except that the pitch-based carbon fibers in Production Example 1 were changed to the following pitch-based carbon fibers to perform a treatment of the carbon fibers to have insulating coating films.

Pitch-based carbon fibers (thermally conductive fibers, average fiber length: 90 μm, average fiber diameter: 9 μm, product of Nippon Graphite Fiber Co., Ltd.)

As a result of measuring the length of the cross section through TEM, coating films having an average thickness of 95 nm and made mainly of $SiO_2$ were observed.

Production Example 4: Treatment of Carbon Fibers to have Insulating Coating Films Covered carbon fibers were obtained in the same manner as in Production Example 1 except that the pitch-based carbon fibers in Production Example 1 were changed to the following pitch-based carbon fibers to perform a treatment of the carbon fibers to have insulating coating films.

Pitch-based carbon fibers (thermally conductive fibers, average fiber length: 110 μm, average fiber diameter: 9 μm, product of Nippon Graphite Fiber Co., Ltd.)

As a result of measuring the length of the cross section through TEM, coating films having an average thickness of 65 nm and made mainly of $SiO_2$ were observed.

Production Examples 1 to 4 employed the same treatment conditions except that the average fiber length of the pitch-based carbon fibers was changed. Even under the same treatment conditions, the thickness of the formed coating film changed by changing the average fiber length of the pitch-based carbon fibers. Specifically, the greater the average fiber length of the carbon fibers was, the smaller the thickness of the formed coating film was. The average fiber length of the carbon fibers is one of the factors that can change the thickness of the coating film.

[Measurement of Shore OO Hardness]

Each of the thermally conductive sheet samples according to Examples 1 to 16 and Comparative Examples 1 to 6 was measured for Shore OO hardness by the measurement method according to ASTM-D2240.

[Measurement of Compressive Stress]

Also, the thermally conductive sheet after pressing of the sheet body according to each of Examples 1 to 16 and Comparative Examples 1 to 6 was measured for the maximum compressive stress when it was 40% compressed at a compression speed of 25.4 mm/min using a tensile and compression tester (product of A&D Company, Limited, TENSILON RTG1225).

[Measurement of Thermal Resistance]

Each of the thermally conductive sheet samples according to Examples 1 to 16 and Comparative Examples 1 to 6 was measured for thermal resistance in the range of a load of 1.0 kgf/cm$^2$ by the method according to ASTM-D5470.

[Measurement of Volume Resistance]

Each of the thermally conductive sheet samples according to Examples 1 to 16 and Comparative Examples 1 to 6 was measured for volume resistance using HIRESTA (MCP-HT800) (product of Mitsubishi Chemical Analytech Co., Ltd.) and a URS probe by the method according to JIS K-6911. An applied voltage was set to 100 V in Examples 1 to 16, 1 V in Comparative Examples 1 to 4, and 100 V in Comparative Examples 5 and 6.

The reason why the applied voltage was set to 1 V in Comparative Examples 1 to 4 is that measurement was possible even when the applied voltage was low unlike in the Examples and Comparative Examples 5 and 6.

Example 1

In Example 1, a silicone resin composition (thermally conductive resin composition) was prepared by dispersing the following in a two-part addition reaction type liquid silicone resin: 20 vol % of alumina particles coupling-treated with a silane coupling agent (thermally conductive particles: product of Denka Company Limited, average particle diameter: 4 μm); 22 vol % of the covered carbon fibers obtained in Production Example 1 (average fiber length: 100 μm, average fiber diameter: 9 μm); and 24 vol % of aluminum nitride coupling-treated with a silane coupling agent (thermally conductive particles: product of Tokuyama Corporation, average particle dimeter: 1 μm).

The two-part addition reaction type liquid silicone resin is a mixture of 50% by mass of silicone A liquid and 50% by mass of silicone B liquid. Note that, silicone A liquid and silicone B liquid used in the following Examples and Comparative Examples are the same as the above silicone A liquid and the above silicone B liquid, respectively.

The obtained silicone resin composition was extruded into a cuboid, hollow mold (30 mm×30 mm) whose inner wall had been attached with a PET film having undergone a release treatment, to form a silicone molded product. The obtained silicone molded product was cured in an oven at 100° C. for 6 hours to be a silicone cured product. The obtained silicone cured product was cut with an ultrasonic cutter to obtain a molded product sheet having a thickness of about 2 mm. The slicing speed of the ultrasonic cutter was set to 50 mm per second. Also, the ultrasonic vibration applied to the ultrasonic cutter was set to 20.5 kHz in oscillating frequency and 60 μm in amplitude.

The obtained molded product sheet was held between PET films having undergone a release treatment, and then was pressed with a spacer having a thickness of 1.97 mm inserted, to obtain a thermally conductive sheet sample covered on the sheet surface with the uncured component of the binder resin. The pressing conditions were set to 3 min at 80° C. and 1 MPa.

The insulating coating films of the covered carbon fibers were found to have a thickness of 77 nm.

The thermally conductive sheet sample was found to have a Shore OO hardness of 61, an initial sheet thickness of 1.998 mm, and a compressive stress of 900 N.

Slight adhesiveness was developed on the sheet surface.

Also, the thermally conductive sheet sample according to Example 1 was found to have a thermal resistance of 1.00 [K·cm$^2$/W] and a volume resistance of $2.3 \times 10^{10}$ [Ω·cm] at an applied voltage of 100 V.

Example 2

A thermally conductive sheet sample was prepared in Example 2 under the same conditions as in Example 1 except that a mixture of 55% by mass of silicone A liquid and 45% by mass of silicone B liquid was used as the two-part addition reaction type liquid silicone resin.

The insulating coating films of the covered carbon fibers were found to have a thickness of 77 nm.

The thermally conductive sheet sample was found to have a Shore OO hardness of 55, an initial sheet thickness of 2.031 mm, and a compressive stress of 700 N.

Slight adhesiveness was developed on the sheet surface.

Also, the thermally conductive sheet sample according to Example 2 was found to have a thermal resistance of 0.95 [K·cm$^2$/W] and a volume resistance of $2.7 \times 10^{10}$ [Ω·cm] at an applied voltage of 100 V.

Example 3

A thermally conductive sheet sample was prepared in Example 3 under the same conditions as in Example 1 except that a mixture of 60% by mass of silicone A liquid and 40% by mass of silicone B liquid was used as the two-part addition reaction type liquid silicone resin.

The insulating coating films of the covered carbon fibers were found to have a thickness of 77 nm.

The thermally conductive sheet sample was found to have a Shore OO hardness of 50, an initial sheet thickness of 2.005 mm, and a compressive stress of 450 N.

Slight adhesiveness was developed on the sheet surface.

Also, the thermally conductive sheet sample according to Example 3 was found to have a thermal resistance of 0.92 [K·cm$^2$/W] and a volume resistance of $3.6 \times 10^{10}$ [Ω·cm] at an applied voltage of 100 V.

Example 4

A thermally conductive sheet sample was prepared in Example 4 under the same conditions as in Example 1 except that a mixture of 65% by mass of silicone A liquid and 35% by mass of silicone B liquid was used as the two-part addition reaction type liquid silicone resin.

The insulating coating films of the covered carbon fibers were found to have a thickness of 77 nm.

The thermally conductive sheet sample was found to have a Shore OO hardness of 42, an initial sheet thickness of 1.982 mm, and a compressive stress of 300 N.

Slight adhesiveness was developed on the sheet surface.

Also, the thermally conductive sheet sample according to Example 4 was found to have a thermal resistance of 0.94 [K·cm$^2$/W] and a volume resistance of $4.4 \times 10^{10}$ [Ω·cm] at an applied voltage of 100 V.

Example 5

A thermally conductive sheet sample was prepared in Example 5 under the same conditions as in Example 1 except that the covered carbon fibers obtained in Production Example 2 (average fiber length: 150 μm) were used as the carbon fibers.

The insulating coating films of the covered carbon fibers were found to have a thickness of 55 nm.

The thermally conductive sheet sample was found to have a Shore OO hardness of 70, an initial sheet thickness of 2.000 mm, and a compressive stress of 950 N.

Slight adhesiveness was developed on the sheet surface.

Also, the thermally conductive sheet sample according to Example 5 was found to have a thermal resistance of 0.91 [K·cm$^2$/W] and a volume resistance of $3.6 \times 10^9$ [Ω·cm] at an applied voltage of 100 V.

Example 6

A thermally conductive sheet sample was prepared in Example 6 under the same conditions as in Example 2 except that the covered carbon fibers obtained in Production Example 2 (average fiber length: 150 μm) were used as the carbon fibers.

The insulating coating films of the covered carbon fibers were found to have a thickness of 55 nm.

The thermally conductive sheet sample was found to have a Shore OO hardness of 58, an initial sheet thickness of 2.009 mm, and a compressive stress of 800 N.

Slight adhesiveness was developed on the sheet surface.

Also, the thermally conductive sheet sample according to Example 6 was found to have a thermal resistance of 0.88 [K·cm$^2$/W] and a volume resistance of $4.7 \times 10^9$ [Ω·cm] at an applied voltage of 100 V.

Example 7

A thermally conductive sheet sample was prepared in Example 7 under the same conditions as in Example 3 except that the covered carbon fibers obtained in Production Example 2 (average fiber length: 150 μm) were used as the carbon fibers.

The insulating coating films of the covered carbon fibers were found to have a thickness of 55 nm.

The thermally conductive sheet sample was found to have a Shore OO hardness of 57, an initial sheet thickness of 1.991 mm, and a compressive stress of 550 N.

Slight adhesiveness was developed on the sheet surface.

Also, the thermally conductive sheet sample according to Example 7 was found to have a thermal resistance of 0.86 [K·cm$^2$/W] and a volume resistance of 6.7×10$^9$ [Ω·cm] at an applied voltage of 100 V.

Example 8

A thermally conductive sheet sample was prepared in Example 8 under the same conditions as in Example 4 except that the covered carbon fibers obtained in Production Example 2 (average fiber length: 150 μm) were used as the carbon fibers.

The insulating coating films of the covered carbon fibers were found to have a thickness of 55 nm.

The thermally conductive sheet sample was found to have a Shore OO hardness of 50, an initial sheet thickness of 2.016 mm, and a compressive stress of 350 N.

Slight adhesiveness was developed on the sheet surface.

Also, the thermally conductive sheet sample according to Example 8 was found to have a thermal resistance of 0.88 [K·cm$^2$/W] and a volume resistance of 8.2×10$^9$ [Ω·cm] at an applied voltage of 100 V.

Example 9

In Example 9, a silicone resin composition (thermally conductive resin composition) was prepared by dispersing the following in a two-part addition reaction type liquid silicone resin: 43 vol % of alumina particles coupling-treated with a silane coupling agent (thermally conductive particles: product of Denka Company Limited, average particle diameter: 4 μm); and 23 vol % of the covered carbon fibers obtained in Production Example 3 (average fiber length: 90 μm, average fiber diameter: 9 μm).

The two-part addition reaction type liquid silicone resin is a mixture of 50% by mass of silicone A liquid and 50% by mass of silicone B liquid.

The obtained silicone resin composition was extruded into a cuboid, hollow mold (30 mm×30 mm) whose inner wall had been attached with a PET film having undergone a release treatment, to form a silicone molded product. The obtained silicone molded product was cured in an oven at 100° C. for 6 hours to be a silicone cured product. The obtained silicone cured product was cut with an ultrasonic cutter to obtain a molded product sheet having a thickness of about 2 mm. The slicing speed of the ultrasonic cutter was set to 50 mm per second. Also, the ultrasonic vibration applied to the ultrasonic cutter was set to 20.5 kHz in oscillating frequency and 60 μm in amplitude.

The obtained molded product sheet was held between PET films having undergone a release treatment, and then was pressed with a spacer inserted, to obtain a thermally conductive sheet sample covered on the sheet surface with the uncured component of the binder resin. The pressing conditions were set to 3 min at 80° C. and 1 MPa.

The insulating coating films of the covered carbon fibers were found to have a thickness of 95 nm.

The thermally conductive sheet sample was found to have a Shore OO hardness of 59, an initial sheet thickness of 2.017 mm, and a compressive stress of 900 N.

Slight adhesiveness was developed on the sheet surface.

Also, the thermally conductive sheet sample according to Example 9 was found to have a thermal resistance of 1.89 [K·cm$^2$/W] and a volume resistance of 1.2×10$^{10}$ [Ω·cm] at an applied voltage of 100 V.

Example 10

A thermally conductive sheet sample was prepared in Example 10 under the same conditions as in Example 9 except that a mixture of 55% by mass of silicone A liquid and 45% by mass of silicone B liquid was used as the two-part addition reaction type liquid silicone resin.

The insulating coating films of the covered carbon fibers were found to have a thickness of 95 nm.

The thermally conductive sheet sample was found to have a Shore OO hardness of 53, an initial sheet thickness of 2.008 mm, and a compressive stress of 800 N.

Slight adhesiveness was developed on the sheet surface.

Also, the thermally conductive sheet sample according to Example 10 was found to have a thermal resistance of 1.83 [K·cm$^2$/W] and a volume resistance of 2.9×10$^{10}$ [Ω·cm] at an applied voltage of 100 V.

Example 11

A thermally conductive sheet sample was prepared in Example 11 under the same conditions as in Example 9 except that a mixture of 60% by mass of silicone A liquid and 40% by mass of silicone B liquid was used as the two-part addition reaction type liquid silicone resin.

The insulating coating films of the covered carbon fibers were found to have a thickness of 95 nm.

The thermally conductive sheet sample was found to have a Shore OO hardness of 51, an initial sheet thickness of 1.982 mm, and a compressive stress of 500 N.

Slight adhesiveness was developed on the sheet surface.

Also, the thermally conductive sheet sample according to Example 11 was found to have a thermal resistance of 1.79 [K·cm$^2$/W] and a volume resistance of 4.2×10$^{10}$ [Ω·cm] at an applied voltage of 100 V.

Example 12

A thermally conductive sheet sample was prepared in Example 12 under the same conditions as in Example 9 except that a mixture of 65% by mass of silicone A liquid and 35% by mass of silicone B liquid was used as the two-part addition reaction type liquid silicone resin.

The insulating coating films of the covered carbon fibers were found to have a thickness of 95 nm.

The thermally conductive sheet sample was found to have a Shore OO hardness of 45, an initial sheet thickness of 1.996 mm, and a compressive stress of 250 N.

Slight adhesiveness was developed on the sheet surface.

Also, the thermally conductive sheet sample according to Example 12 was found to have a thermal resistance of 1.85 [K·cm$^2$/W] and a volume resistance of 5.5×10$^{10}$ [Ω·cm] at an applied voltage of 100 V.

Example 13

A molded product sheet was prepared in Example 13 under the same conditions as in Example 3 except that the covered carbon fibers obtained in Production Example 4 (average fiber length: 110 µm) were used.

The obtained molded product sheet was held between PET films having undergone a release treatment, and then was pressed with a spacer having a thickness of 1.97 mm inserted, to obtain a thermally conductive sheet sample covered on the sheet surface with the uncured component of the binder resin. The pressing conditions were set to 30 sec at 100° C. and 1 MPa. By making the temperature higher and the pressing time shorter, the sheet surface was allowed to be covered with the component not contributing to the reaction, while reflecting the shapes of the thermally conductive fillers.

The insulating coating films of the covered carbon fibers were found to have a thickness of 65 nm.

The thermally conductive sheet sample was found to have a Shore OO hardness of 52, an initial sheet thickness of 2.011 mm, and a compressive stress of 500 N.

Slight adhesiveness was developed on the sheet surface.

Also, the thermally conductive sheet sample according to Example 13 was found to have a thermal resistance of 0.85 [K·cm$^2$/W] and a volume resistance of 8.9×10$^9$ [Ω·cm] at an applied voltage of 100 V.

Example 14

A molded product sheet was prepared in Example 14 under the same conditions as in Example 4 except that the covered carbon fibers obtained in Production Example 4 (average fiber length: 110 µm) were used.

The obtained molded product sheet was held between PET films having undergone a release treatment, and then was pressed with a spacer having a thickness of 1.97 mm inserted, to obtain a thermally conductive sheet sample covered on the sheet surface with the uncured component of the binder resin. The pressing conditions were set to 30 sec at 100° C. and 1 MPa. By making the temperature higher and the pressing time shorter, the sheet surface was allowed to be covered with the component not contributing to the reaction, while reflecting the shapes of the thermally conductive fillers.

The insulating coating films of the covered carbon fibers were found to have a thickness of 65 nm.

The thermally conductive sheet sample was found to have a Shore OO hardness of 48, an initial sheet thickness of 1.978 mm, and a compressive stress of 330 N.

Slight adhesiveness was developed on the sheet surface.

Also, the thermally conductive sheet sample according to Example 14 was found to have a thermal resistance of 0.84 [K·cm$^2$/W] and a volume resistance of 8.3×10$^9$ [Ω·cm] at an applied voltage of 100 V.

Example 15

A molded product sheet was prepared in Example 15 under the same conditions as in Example 3 except that the covered carbon fibers obtained in Production Example 4 (average fiber length: 110 µm) were used.

The obtained molded product sheet was held between PET films having undergone a release treatment, and then was left to stand for one day without pressing, to obtain a thermally conductive sheet sample covered on the sheet surface with the uncured component of the binder resin. The sheet surface was allowed to be covered with the component not contributing to the reaction, while reflecting the shapes of the thermally conductive fillers.

The insulating coating films of the covered carbon fibers were found to have a thickness of 65 nm.

The thermally conductive sheet sample was found to have a Shore OO hardness of 50, an initial sheet thickness of 2.023 mm, and a compressive stress of 400 N.

Slight adhesiveness was developed on the sheet surface.

Also, the thermally conductive sheet sample according to Example 15 was found to have a thermal resistance of 0.88 [K·cm$^2$/W] and a volume resistance of 9.4×10$^9$ [Ω·cm] at an applied voltage of 100 V.

Example 16

A molded product sheet was prepared in Example 16 under the same conditions as in Example 3 except that the covered carbon fibers obtained in Production Example 4 (average fiber length: 110 µm) were used.

The obtained molded product sheet was held between PET films having undergone a release treatment, and then was left to stand for one week without pressing, to obtain a thermally conductive sheet sample covered on the sheet surface with the uncured component of the binder resin. The sheet surface was allowed to be covered with the component not contributing to the reaction, while reflecting the shapes of the thermally conductive fillers.

The insulating coating films of the covered carbon fibers were found to have a thickness of 65 nm.

The thermally conductive sheet sample was found to have a Shore OO hardness of 49, an initial sheet thickness of 2.001 mm, and a compressive stress of 350 N.

Slight adhesiveness was developed on the sheet surface.

Also, the thermally conductive sheet sample according to Example 16 was found to have a thermal resistance of 0.90 [K·cm$^2$/W] and a volume resistance of 1.2×10$^{10}$ [Ω·cm] at an applied voltage of 100 V.

Comparative Example 1

A thermally conductive sheet sample was prepared in Comparative Example 1 under the same conditions as in Example 1 except that pitch-based carbon fibers not treated to have insulating coating films (thermally conductive fibers: product of Nippon Graphite Fiber Co., Ltd., average fiber length: 100 µm, average fiber diameter: 9 µm) were used.

The thermally conductive sheet sample according to Comparative Example 1 was found to have a Shore OO hardness of 72, an initial sheet thickness of 2.010 mm, and a compressive stress of 1000 N.

Slight adhesiveness was developed on the sheet surface.

Also, the thermally conductive sheet sample according to Comparative Example 1 was found to have a thermal resistance of 0.88 [K·cm$^2$/W] and a volume resistance of 3.4×10$^4$ [Ω·cm] at an applied voltage of 1 V.

Comparative Example 2

A thermally conductive sheet sample was prepared in Comparative Example 2 under the same conditions as in Example 2 except that pitch-based carbon fibers not treated to have insulating coating films (thermally conductive fibers: product of Nippon Graphite Fiber Co., Ltd., average fiber length: 100 µm, average fiber diameter: 9 µm) were used.

The thermally conductive sheet sample according to Comparative Example 2 was found to have a Shore OO hardness of 63, an initial sheet thickness of 1.99 mm, and a compressive stress of 900 N.

Slight adhesiveness was developed on the sheet surface.

Also, the thermally conductive sheet sample according to Comparative Example 2 was found to have a thermal resistance of 0.85 [K·cm$^2$/W] and a volume resistance of $3.6 \times 10^4$ [Ω·cm] at an applied voltage of 1 V.

Comparative Example 3

A thermally conductive sheet sample was prepared in Comparative Example 3 under the same conditions as in Example 3 except that pitch-based carbon fibers not treated to have insulating coating films (thermally conductive fibers: product of Nippon Graphite Fiber Co., Ltd., average fiber length: 100 μm, average fiber diameter: 9 μm) were used.

The thermally conductive sheet sample according to Comparative Example 3 was found to have a Shore OO hardness of 59, an initial sheet thickness of 1.999 mm, and a compressive stress of 450 N.

Slight adhesiveness was developed on the sheet surface.

Also, the thermally conductive sheet sample according to Comparative Example 3 was found to have a thermal resistance of 0.84 [K·cm$^2$/W] and a volume resistance of $3.9 \times 10^4$ [Ω·cm] at an applied voltage of 1 V.

Comparative Example 4

A thermally conductive sheet sample was prepared in Comparative Example 4 under the same conditions as in Example 4 except that pitch-based carbon fibers not treated to have insulating coating films (thermally conductive fibers: product of Nippon Graphite Fiber Co., Ltd., average fiber length: 100 μm, average fiber diameter: 9 μm) were used.

The thermally conductive sheet sample according to Comparative Example 4 was found to have a Shore OO hardness of 50, an initial sheet thickness of 2.005 mm, and a compressive stress of 300 N.

Slight adhesiveness was developed on the sheet surface.

Also, the thermally conductive sheet sample according to Comparative Example 4 was found to have a thermal resistance of 0.87 [K·cm$^2$/W] and a volume resistance of $4.7 \times 10^4$ [Ω·cm] at an applied voltage of 1 V.

Comparative Example 5

A thermally conductive sheet sample was prepared in Comparative Example 5 by coating the thermally conductive sheet obtained in Comparative Example 1 with a mixture of 50% by mass of silicone A liquid and 50% by mass of silicone B liquid serving as the two-part addition reaction type liquid silicone resin.

The thermally conductive sheet sample according to Comparative Example 5 was found to have a Shore OO hardness of 75, an initial sheet thickness of 2.030 mm, and a compressive stress of 1050 N.

Slight adhesiveness was developed on the sheet surface.

Also, the thermally conductive sheet sample according to Comparative Example 5 was found to have a thermal resistance of 2.43 [K·cm$^2$/W] and a volume resistance of $1.0 \times 10^{12}$ [Ω·cm] at an applied voltage of 100 V.

Comparative Example 6

A thermally conductive sheet sample was prepared in Comparative Example 6 under the same conditions as in Comparative Example 5 except that a mixture of 45% by mass of silicone A liquid and 55% by mass of silicone B liquid was used as the two-part addition reaction type liquid silicone resin to be coated.

The thermally conductive sheet sample according to Comparative Example 6 was found to have a Shore OO hardness of 75, an initial sheet thickness of 2.015 min, and a compressive stress of 1200 N.

Slight adhesiveness was not developed on the sheet surface.

Also, the thermally conductive sheet sample according to Comparative Example 6 was found to have a thermal resistance of 2.56 [K·cm$^2$/W] and a volume resistance of $8.1 \times 10^{11}$ [Ω·cm] at an applied voltage of 100 V.

[Evaluation of Slight Adhesiveness]

Each of the thermally conductive sheet samples according to Examples 1 to 16 and Comparative Examples 1 to 6 was evaluated for slight adhesiveness. The evaluation of slight adhesiveness was performed using a thermally conductive sheet for slight adhesiveness evaluation obtained in the following manner. Specifically, the silicone cured product according to each of Examples 1 to 16 and Comparative Examples 1 to 6 was sliced to obtain a molded product sheet. The obtained molded product sheet was held between PET films not having undergone a release treatment, and then was pressed for 3 min at 80° C. and 2.45 MPa with a spacer having a thickness of 1.97 mm inserted, followed by cooling to ambient temperature, to obtain the thermally conductive sheet for slight adhesiveness evaluation.

The end of the PET film of the thermally conductive sheet sample for slight adhesiveness evaluation was peeled off by hand and was held with a tester. Then, the end of the PET film was pulled 90° upward at a speed of 50 mm/mm, and the load was measured to evaluate slight adhesiveness (tackiness) based on the peeling force (load). The peeling force of each sample was measured in a predetermined range. The slight adhesiveness was evaluated according to the following evaluation criteria.

[Evaluation Criteria]

A (Best): The peeling force indicated a reading in the range of from 0.05 to 0.25 (N/cm).

B (Good): The peeling force indicated a reading in the range of from 0.02 to 0.05 (N/cm) or from 0.20 to 0.30 (N/cm).

C (Normal): The peeling force indicated a reading in the range of from 0 to 0.04 (N/cm).

D (Poor): Evan a part of the sheet did not develop slight adhesiveness.

TABLE 1

|  | Ex. 1 | Ex. 2 | Ex. 3 | Ex. 4 | Ex. 5 | Ex. 6 |
| --- | --- | --- | --- | --- | --- | --- |
| Silicone resin A liquid [%] | 50 | 55 | 60 | 65 | 50 | 55 |
| Silicone resin B liquid [%] | 50 | 45 | 40 | 35 | 50 | 45 |
| Fiber length of carbon fiber [μm] | 100 | 100 | 100 | 100 | 150 | 150 |
| Thickness of insulating coating film [nm] | 77 | 77 | 77 | 77 | 55 | 55 |

TABLE 1-continued

|  | Ex. 1 | Ex. 2 | Ex. 3 | Ex. 4 | Ex. 5 | Ex. 6 |
|---|---|---|---|---|---|---|
| Slight adhesiveness | C | B | A | A | C | B |
| Shore OO hardness | 61 | 55 | 50 | 42 | 70 | 58 |
| Compressive stress [N] | 900 | 700 | 450 | 300 | 950 | 800 |
| Initial sheet thickness [mm] | 1.998 | 2.031 | 2.005 | 1.982 | 2.000 | 2.009 |
| Thermal resistance [K·cm$^2$/W] | 1.00 | 0.95 | 0.92 | 0.94 | 0.91 | 0.88 |
| Volume resistance [Ω·cm] | $2.3 \times 10^{10}$ | $2.7 \times 10^{10}$ | $3.6 \times 10^{10}$ | $4.4 \times 10^{10}$ | $3.6 \times 10^{9}$ | $4.7 \times 10^{9}$ |

TABLE 2

|  | Ex. 7 | Ex. 8 | Ex. 9 | Ex. 10 | Ex. 11 | Ex. 12 |
|---|---|---|---|---|---|---|
| Silicone resin A liquid [%] | 60 | 65 | 50 | 55 | 60 | 65 |
| Silicone resin B liquid [%] | 40 | 35 | 50 | 45 | 40 | 35 |
| Fiber length of carbon fiber [μm] | 150 | 150 | 90 | 90 | 90 | 90 |
| Thickness of insulating coating film [nm] | 55 | 55 | 95 | 95 | 95 | 95 |
| Slight adhesiveness | A | A | C | B | A | A |
| Shore OO hardness | 57 | 50 | 59 | 53 | 51 | 45 |
| Compressive stress [N] | 550 | 350 | 900 | 800 | 500 | 250 |
| Initial sheet thickness [mm] | 1.991 | 2.016 | 2.017 | 2.008 | 1.982 | 1.996 |
| Thermal resistance [K·cm$^2$/W] | 0.86 | 0.88 | 1.89 | 1.83 | 1.79 | 1.85 |
| Volume resistance [Ω·cm] | $6.7 \times 10^{9}$ | $8.2 \times 10^{9}$ | $1.2 \times 10^{10}$ | $2.9 \times 10^{10}$ | $4.2 \times 10^{10}$ | $5.5 \times 10^{10}$ |

TABLE 3

|  | Ex. 13 | Ex. 14 | Ex. 15 | Ex. 16 |
|---|---|---|---|---|
| Silicone resin A liquid [%] | 60 | 65 | 60 | 60 |
| Silicone resin B liquid [%] | 40 | 35 | 40 | 40 |
| Fiber length of carbon fiber [μm] | 110 | 110 | 110 | 110 |
| Thickness of insulating coating film [nm] | 65 | 65 | 65 | 65 |
| Slight adhesiveness | A | A | A | A |
| Shore OO hardness | 52 | 48 | 50 | 49 |
| Compressive stress [N] | 500 | 330 | 400 | 350 |
| Initial sheet thickness [mm] | 2.011 | 1.978 | 2.023 | 2.001 |
| Thermal resistance [K·cm$^2$/W] | 0.85 | 0.84 | 0.88 | 0.90 |
| Volume resistance [Ω·cm] | $8.9 \times 10^{9}$ | $8.3 \times 10^{9}$ | $9.4 \times 10^{9}$ | $1.2 \times 10^{10}$ | thicknesses in the range of 50 nm or more but less than 100 nm. Thus, the insulating coating films were formed with desired film thicknesses to have good volume resistance. In addition, they were able to suppress formation of silica fine particles and prevent a decrease in thermal conductivity. In the thermally conductive sheet samples according to Examples 1 to 16, the carbon fibers exposed on the sheet surface have exposed carbon fibers as a result of their insulating coating films being cut upon slicing. However, they are covered with the uncured component of the binder resin and thus have insulating property to surrounding members without degradation in thermal conductivity.

In Examples 1 to 12 and 16, the obtained thermally conductive sheets had smooth surfaces as illustrated in FIG. 5. In Examples 13 to 15, the obtained thermally conductive sheets had surfaces having convex portions derived from the carbon fibers exposed on the surfaces of the sheet bodies as illustrated in FIG. 6.

TABLE 4

|  | Comp. Ex. 1 | Comp. Ex. 2 | Comp. Ex. 3 | Comp. Ex. 4 | Comp. Ex. 5 | Comp. Ex. 6 |
|---|---|---|---|---|---|---|
| Silicone resin A liquid [%] | 50 | 55 | 60 | 65 | 50 | 45 |
| Silicone resin B liquid [%] | 50 | 45 | 40 | 35 | 50 | 55 |
| Fiber length of carbon fiber [μm] | 100 | 100 | 100 | 100 | 100 | 100 |
| Slight adhesiveness | C | B | A | A | C | D |
| Shore OO hardness | 72 | 63 | 59 | 50 | 75 | 75 |
| Compressive stress [N] | 1000 | 900 | 450 | 300 | 1050 | 1200 |
| Initial sheet thickness [mm] | 2.010 | 1.990 | 1.999 | 2.005 | 2.030 | 2.015 |
| Thermal resistance [K·cm$^2$/W] | 0.88 | 0.85 | 0.84 | 0.87 | 2.43 | 2.56 |
| Volume resistance [Ω·cm] | $3.4 \times 10^{4}$ | $3.6 \times 10^{4}$ | $3.9 \times 10^{4}$ | $4.7 \times 10^{4}$ | $1.0 \times 10^{12}$ | $8.1 \times 10^{11}$ |

As presented in Tables 1 to 4, the thermally conductive sheet samples according to Examples 1 to 16 exhibited the maximum thermal resistance of 1.89 [K·cm$^2$/W] and the minimum volume resistance of $3.6 \times 10^{9}$ [Ω·cm], achieving both thermal resistance and insulating property at almost desired levels. The reason for this is as follows. Specifically, the carbon fibers contained in the thermally conductive sheet samples were covered with insulating coating films having Meanwhile, the thermally conductive sheet samples according to Comparative Examples 1 to 4 use the carbon fibers not provided with insulating coating films. Thus, their thermal resistance could be suppressed to be low, but their volume resistance was low; i.e., their insulating property was insufficient. In Comparative Example 5 and Comparative Example 6, the thermally conductive sheet samples were further coated with the binder resin, and thus their volume resistance was high; i.e., their insulating property was excellent. However, the carbon fibers were buried in the binder resin to lead to increased thermal resistance.

In the thermally conductive sheet sample according to Comparative Example 6, the compositional ratio of the silicone A liquid of the coated silicone resin was as low as 45%, and thus the uncured component did not remain in a sufficient amount. As a result, the uncured component did not entirely cover the surface of the sheet even by pressing, and slight adhesiveness did not develop at a part thereof. Therefore, it is impossible for the thermally conductive sheet sample according to Comparative Example 6 to be temporarily fixed to a connection target at the place where slight adhesiveness does not develop, which leads to poor operability. Also, the thermally conductive sheet sample according to Comparative Example 6 lacked flexibility and was degraded in followability and close adhesiveness to the connection target, and was increased in thermal resistance.

REFERENCE SIGNS LIST 1 thermally conductive sheet
2 heat spreader
2a main surface
3 electronic part
3a top surface
4 heat-dissipating member
5 heat sink
6 circuit board
7 sheet body
8 uncured component
9 resin molded product
10 spacer
11 carbon fibers
12 insulating coating films
13 slicing device

What is claimed is:

1. A thermally conductive sheet comprising
a sheet body that is a cured product of a thermally conductive resin composition including a binder resin and carbon fibers covered with insulating coating films,
wherein the carbon fibers exposed on a surface of the sheet body are not covered with the insulating coating films and are covered with a component of the binder resin.

2. The thermally conductive sheet according to claim 1, wherein a surface of the thermally conductive sheet includes convex portions derived from the carbon fibers exposed on the surface of the sheet body.

3. The thermally conductive sheet according to claim 1, wherein the insulating coating films covering the carbon fibers are silicon oxide, and
wherein an average thickness of the insulating coating films is 50 nm or more but less than 100 nm as observed through cross-sectional TEM observation.

4. The thermally conductive sheet according to claim 1, wherein a Shore OO hardness of the thermally conductive sheet is 70 or lower as measured by a measurement method according to ASTM-D2240.

5. The thermally conductive sheet according to claim 1, wherein the sheet body includes thermally conductive fillers.

6. The thermally conductive sheet according to claim 1, wherein the surface of the sheet body is covered with an uncured component of the binder resin.

7. A method for producing a thermally conductive sheet, the method comprising:
molding a thermally conductive resin composition, including a binder resin and carbon fibers covered with insulating coating films, into a predetermined shape and curing the thermally conductive resin composition, to thereby obtain a molded product of the thermally conductive resin composition;
cutting the molded product into a sheet to obtain a sheet body; and
covering the carbon fibers exposed on a surface of the sheet body with a component of the binder resin,
wherein in the cutting, the insulating coating films covering the carbon fibers exposed on the surface of the sheet body are removed.

8. The method for producing a thermally conductive sheet according to claim 7, wherein the covering is pressing the sheet body to cover the surface of the sheet body and the carbon fibers exposed from the surface of the sheet body with an uncured component of the binder resin oozed out from the sheet body.

9. The method for producing a thermally conductive sheet according to claim 7, wherein the covering is leaving the sheet body to stand to cover the surface of the sheet body and the carbon fibers exposed from the surface of the sheet body with an uncured component of the binder resin oozed out from the sheet body.

10. The method for producing a thermally conductive sheet according to claim 7, wherein the thermally conductive resin composition is extruded and charged into a hollow mold, and the thermally conductive resin composition is thermally cured to form the molded product where the carbon fibers are randomly oriented with respect to a direction of extrusion.

11. A heat-dissipating member comprising:
a heat spreader configured to dissipate heat generated by an electronic part; and
the thermally conductive sheet according to claim 1, the thermally conductive sheet being disposed on the heat spreader and held between the heat spreader and the electronic part.

12. A semiconductor device comprising:
a semiconductor element;
a heat spreader configured to dissipate heat generated by the semiconductor element; and
the thermally conductive sheet according to claim 1, the thermally conductive sheet being disposed on the heat spreader and held between the heat spreader and the semiconductor element.

13. The semiconductor device according to claim 12, further comprising a heat sink,
wherein a thermally conductive sheet is held between the heat spreader and the heat sink,
wherein the thermally conductive sheet held between the heat spreader and the heat sink comprises a sheet body that is a cured product of a thermally conductive resin composition including a binder resin and carbon fibers covered with insulating coating films, and
wherein the carbon fibers exposed on a surface of the sheet body are not covered with the insulating coating films and are covered with a component of the binder resin.

* * * * *